United States Patent
Zhu et al.

(10) Patent No.: US 7,521,307 B2
(45) Date of Patent: Apr. 21, 2009

(54) CMOS STRUCTURES AND METHODS USING SELF-ALIGNED DUAL STRESSED LAYERS

(75) Inventors: Huilong Zhu, Poughkeepsie, NY (US); Daewon Yang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 292 days.

(21) Appl. No.: 11/380,695

(22) Filed: Apr. 28, 2006

(65) Prior Publication Data

US 2007/0252214 A1    Nov. 1, 2007

(51) Int. Cl.
*H01L 21/8238* (2006.01)
(52) U.S. Cl. .............................. 438/199; 257/E21.633; 438/717
(58) Field of Classification Search ........... 257/E21.633
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke et al. | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |
| 5,592,007 A | 1/1997 | Leedy | |

(Continued)

FOREIGN PATENT DOCUMENTS

JP    64-76755    3/1989

OTHER PUBLICATIONS

Kern Rim, et al., "Transconductance Enhancement in Deep Submicron Strained-Si n-MOSFETs", International Electron Devices Meeting, 26,8,1, IEEE, Sep. 1998.

(Continued)

*Primary Examiner*—Zandra Smith
*Assistant Examiner*—Sun M Kim
(74) *Attorney, Agent, or Firm*—Scully, Scott, Murphy & Presser, P.C.; Joseph P. Abate, Esq.

(57) ABSTRACT

A CMOS structure and methods for fabricating the CMOS structure provide that a first stressed layer located over a first transistor and a second stressed layer located over a second transistor abut but do not overlap. Such an abutment absent overlap provides for enhanced manufacturing flexibility when forming a contact to a silicide layer upon a source/drain region within one of the first transistor and the second transistor.

6 Claims, 9 Drawing Sheets

U.S. PATENT DOCUMENTS

| | | | |
|---|---|---|---|
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | von Ehrenwall | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,621,392 B1 | 9/2003 | Volant et al. | |
| 6,635,506 B2 | 10/2003 | Volant et al. | |
| 6,717,216 B1 | 4/2004 | Doris et al. | |
| 6,825,529 B2 | 11/2004 | Chidambarrao et al. | |
| 6,831,292 B2 | 12/2004 | Currie et al. | |
| 6,974,981 B2 | 12/2005 | Chidambarrao et al. | |
| 6,977,194 B2 | 12/2005 | Belyansky et al. | |
| 7,015,082 B2 | 3/2006 | Doris et al. | |
| 7,101,744 B1* | 9/2006 | Dyer et al. | 257/E21.633 |
| 7,105,394 B2* | 9/2006 | Hachimine et al. | 257/E21.633 |
| 7,148,559 B2* | 12/2006 | Chan et al. | 257/E21.633 |
| 7,288,451 B2* | 10/2007 | Zhu et al. | 257/E21.633 |
| 7,297,584 B2* | 11/2007 | Park et al. | 257/E21.633 |
| 2001/0009784 A1 | 7/2001 | Ma et al. | |
| 2002/0063292 A1 | 5/2002 | Armstrong et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2004/0113174 A1 | 6/2004 | Chidambarrao et al. | |
| 2004/0113217 A1 | 6/2004 | Chidambarrao et al. | |
| 2004/0238914 A1 | 12/2004 | Deshpande et al. | |
| 2004/0262784 A1 | 12/2004 | Doris et al. | |
| 2005/0040460 A1 | 2/2005 | Chidambarrao et al. | |
| 2005/0082634 A1 | 4/2005 | Doris et al. | |
| 2005/0093030 A1 | 5/2005 | Doris et al. | |
| 2005/0098829 A1 | 5/2005 | Doris et al. | |
| 2005/0106799 A1* | 5/2005 | Doris et al. | 438/199 |
| 2005/0145954 A1 | 7/2005 | Zhu et al. | |
| 2005/0148146 A1 | 7/2005 | Doris et al. | |
| 2005/0194699 A1 | 9/2005 | Belyansky et al. | |
| 2005/0236668 A1 | 10/2005 | Zhu et al. | |
| 2005/0245017 A1 | 11/2005 | Belyansky et al. | |
| 2005/0280051 A1 | 12/2005 | Chidambarrao et al. | |
| 2005/0282325 A1 | 12/2005 | Belyansky et al. | |
| 2006/0027868 A1 | 2/2006 | Doris et al. | |
| 2006/0057787 A1 | 3/2006 | Doris et al. | |
| 2006/0060925 A1 | 3/2006 | Doris et al. | |
| 2006/0079046 A1* | 4/2006 | Yang et al. | 438/199 |
| 2006/0228848 A1* | 10/2006 | Chan et al. | 438/199 |

OTHER PUBLICATIONS

Kern Rim, et al., "Characteristics and Device Design of Sub-100 nm Strained Si N- and PMOSFETs." 2002 Symposium on VLSI Technology Digest of Technical Papers, IEEE, pp. 98-99.

Gregory Scott, et al., "NMOS Drive Current Reduction Caused by Transistor Layout and Trench Isolation Induced Stress." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Pnax/Pt =350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett. 56 (5), Jan. 29, 1990, pp. 460-462.

Q. Ouyang et al., "Two-Dimensional Bandgap Engineering in a Novel Si/SiGe pMOSFET with Enhanced Device Performance and Scalability". 2000 IEEE, pp. 151-154.

* cited by examiner

CMOS STRUCTURES AND METHODS USING SELF-ALIGNED DUAL STRESSED LAYERS

BACKGROUND

1. Field of the Invention

The invention relates generally to mechanical stress within complementary metal oxide semiconductor (CMOS) structures. More particularly, the invention relates to structures and methods that provide mechanical stress within CMOS structures to enhance device performance and improve chip yield.

2. Description of the Related Art

CMOS structures comprise complementary mated pairs of field effect transistors of differing conductivity type. Due to the use of complementary mated pairs of differing conductivity type, CMOS structures also provide for reduced energy or power consumption.

A trend within CMOS fabrication is the use of stressed layers as a means to produce a mechanical stress or strain field within a channel region of a CMOS transistor. Certain types of mechanical stresses are desirable insofar as they introduce a stress into a semiconductor channel. Such a stress generally provides for enhanced charge carrier mobilities within a CMOS transistor. Complementary types of channel stress (i.e., tensile or compressive stress or strain in the direction of electrical current) enhance complementary types of charge carrier mobility (i.e., electron or hole) within complementary types of CMOS transistors (i.e., nFET or pFET).

Since mechanical stress is a significant factor that may considerably improve field effect transistor performance, CMOS structures and methods that provide for enhanced levels of mechanical stress within CMOS transistor channels are desirable.

Methods for improving charge carrier mobility within CMOS structures that include pFET and nFET devices are known in the semiconductor fabrication art. For example, En et al, in U.S. Pat. No. 6,573,172 teaches the use of a tensile stressed layer over a pFET device to provide a compressive stress of a pFET channel therein and a compressive stressed layer over an nFET device to cause a tensile stress of an nFET channel therein.

Since use of mechanical stress as a means to enhance charge carrier mobility is likely to continue within future generations of CMOS transistors, desirable are additional CMOS structures and methods for fabrication thereof that provide for charge carrier mobility enhancement incident to use of mechanical stress effects.

SUMMARY OF THE INVENTION

The invention provides CMOS structures and methods for fabrication thereof wherein complementary transistors are covered with appropriate complementary stressed layers for purposes of providing a mechanical stress effect and enhancing a charge carrier mobility. The complementary stressed layers abut, but do not overlap at a location interposed between a pair of complementary transistors within the CMOS structure. In particular, the complementary stressed layers abut, and neither overlap, nor underlap, at a location over a source/drain region where a contact via is intended to be formed. When a silicide layer is located upon the source/drain region, absence of underlap or overlap of the complementary stressed layers provides for an enhanced manufacturing process window or improved chip yield, while avoiding overetching into the silicide layer or underetching into the complementary stressed layers.

The invention also provides an etching method for fabricating the CMOS structure. Within the etching method, at least one of a first stressed layer and a second stressed layer different from the first stressed layer that overlap and abut interposed between a first transistor and a second transistor is etched so that the first stressed layer and the second stressed layer abut, but do not overlap.

A CMOS structure in accordance with the invention includes a first transistor of a first polarity located laterally separated from a second transistor of a second polarity different from the first polarity over a semiconductor substrate. The CMOS structure also includes a first stressed layer having a first stress located over the first transistor and a second stressed layer having a second stress different from the first stress located over the second transistor. Within the CMOS structure, the first stressed layer and the second stressed layer abut and do not overlap.

A particular method for fabricating a CMOS structure in accordance with the invention includes forming a first transistor of a first polarity laterally separated from a second transistor of a second polarity different from the first polarity over a semiconductor substrate. The particular method also includes forming a first stressed layer having a first stress located over the first transistor and a second stressed layer having a second stress different from the first stress located over the second transistor. Within this particular method, the first stressed layer and the second stressed layer abut and overlap. This particular method also includes etching at least one of the first stressed layer and the second stressed layer so that the first stressed layer and the second stressed layer abut and do not overlap.

Another method for fabricating a CMOS structure includes forming a first transistor of a first polarity laterally separated from a second transistor of a second polarity different than the first polarity over a semiconductor substrate. This other method also includes forming a first stressed layer having a first stress located over the first transistor and a second stressed layer having a second stress different from the first stress located over the second transistor. Within this other method, the first stressed layer and the second stressed layer abut and overlap. This other method also includes further masking at least one of the first transistor and the second transistor to leave exposed at least the portion of the first stressed layer and the second stressed layer that abut and overlap. This other method also includes etching at least one of the first stressed layer and the second stressed layer so that the first stressed layer and the second stressed layer abut and do not overlap.

Within the disclosed invention the phrase "abut and do not overlap" is intended to describe a disposition and location of a first stressed layer and a second stressed layer that contact completely at end portions thereof. In addition, no portion of either the first stressed layer or the second stressed layer lies above the other of the first stressed layer or the second stressed layer.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENT

The invention, which provides CMOS structures and methods for fabrication thereof that include complementary stressed layers that abut and do not overlap, is described in further detail within the context of the description below. The description below is understood within the context of the drawings described above. Since the drawings are intended for illustrative purposes, they are not necessarily drawn to scale.

FIG. 1 to FIG. 9 show a series of schematic cross-sectional diagrams illustrating the results of progressive stages in fabricating a CMOS structure in accordance with an embodiment of the invention.

Figure 1:
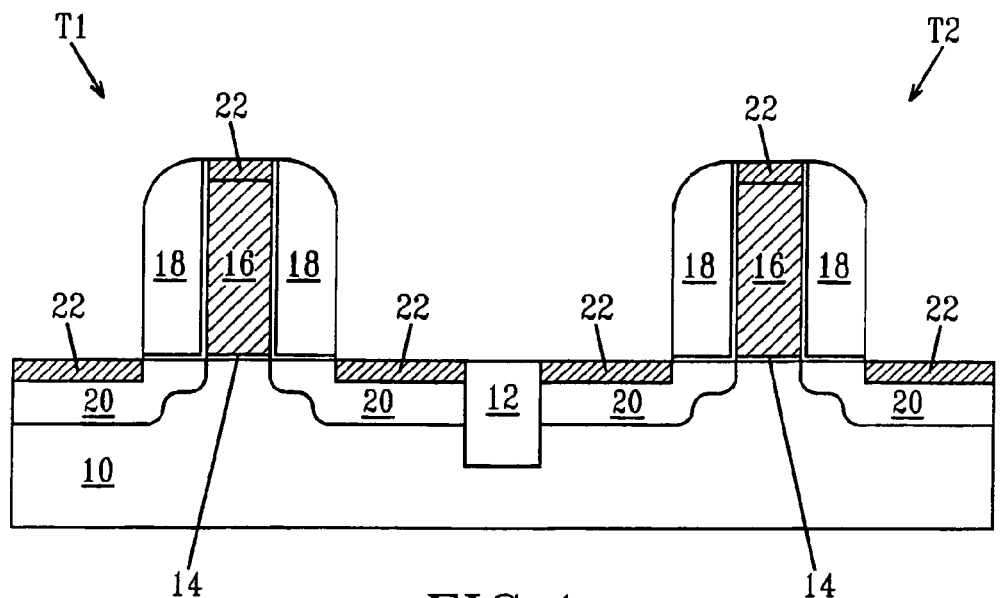
FIG. 1 to FIG. 9 show a series of schematic cross-sectional diagrams illustrating the results of progressive stages in fabricating a CMOS structure in accordance with an embodiment of the invention.

FIG. 1 shows a semiconductor substrate 10 that comprises active regions separated by an isolation region 12. A first transistor T1 is located upon one active region and a second transistor T2 is located upon an adjacent active region. Transistors T1 and T2 are of different polarity (i.e., conductivity type) and thus the doping type in each of active regions is different. The transistors T1 and T2 comprise gate dielectrics 14 located upon the active regions of the semiconductor substrate 10. Gate electrodes 16 are aligned upon gate dielectrics 14, although such alignment is not a requirement of the invention. Two part spacer layers 18 (i.e. "L" or inverted "L" portions adjoining gate electrodes 16 and spacer shaped portions nested therein) adjoin gate electrodes 16 and are illustrated as mirrored spacer 18 components although they are single components that surround each individual gate 16. Source/drain regions 20 are located within the active regions of the semiconductor substrate and separated by channel regions located beneath the gate electrodes 16. Silicide layers 22 are located upon source/drain regions 20 and gate electrodes 16.

Each of the foregoing semiconductor substrate 10, layers and structures may comprise materials and have dimensions that are conventional in the semiconductor fabrication art. Each of the foregoing semiconductor substrate 10, layers and structures may be formed using methods that are conventional in the semiconductor fabrication art.

The semiconductor substrate 10 comprises a semiconductor material. Non-limiting examples of semiconductor materials from which may be comprised the semiconductor substrate 10 include silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials.

The embodiments and the invention contemplate that the semiconductor substrate 10 may comprise a bulk semiconductor substrate. Alternatively, the embodiment and the invention also contemplates that the semiconductor substrate 10 may comprise a semiconductor-on-insulator substrate. As a further alternative, the embodiments and the invention also contemplate that the semiconductor substrate may comprise a hybrid orientation substrate.

A semiconductor-on-insulator substrate comprises a base semiconductor substrate, a buried dielectric layer located thereupon and a surface semiconductor layer located further thereupon. A hybrid orientation substrate comprises a semiconductor substrate having multiple crystallographic orientations that may provide different crystallographic orientation channel regions for each transistor within a CMOS structure.

Semiconductor-on-insulator substrates and hybrid orientation substrates may be formed using any of several layer lamination methods and layer transfer methods. The foregoing substrates may also be formed using separation by implantation of oxygen (SIMOX) methods.

The isolation region 12 comprises a dielectric isolation material. The embodiments and the invention contemplate that isolation regions may comprise shallow trench isolation regions, deep trench isolation regions and, to a lesser extent, local oxidation of silicon isolation regions. The dielectric isolation material from which is comprised the isolation region 12 may comprise an oxide, a nitride and/or an oxynitride of silicon. Oxides, nitrides and oxynitrides of other elements are not excluded as dielectric isolation materials. Dielectric isolation materials may be formed using methods including, but not limited to: thermal or plasma oxidation or nitridation methods, chemical vapor deposition methods and physical vapor deposition methods. Typically, the isolation region 12 is formed at least in part from a silicon oxide dielectric isolation material that has a thickness from about 100 to about 50000 angstroms, where the thickness is highly dependent upon the use of a SOI or a bulk semiconductor substrate.

The gate dielectrics 14 may comprise generally conventional gate dielectric materials having a dielectric constant from about 4 to about 20, measured in vacuum. Such generally conventional gate dielectric materials may include, but are not limited to: oxides, nitrides and oxynitrides of silicon. They may be formed using methods analogous or identical to those disclosed above with respect to forming the isolation region 12. Alternatively, the gate dielectrics 14 may also comprise generally higher dielectric constant dielectric materials having a dielectric constant from about 20 to at least about 100, also measured in a vacuum. These generally higher dielectric constant dielectric materials may include, but are not limited to: hafnium oxides, hafnium silicates, titanium oxides, lanthanum oxides, barium-strontium titantates (BSTs) and lead-zirconate titantates (PZTs). Typically, the gate dielectrics 14 comprise a thermal silicon oxide gate dielectric material having a thickness from about 5 to about 70 angstroms.

The gate electrodes 18 comprise gate electrode conductor materials. Typical gate electrode conductor materials include certain metals, metal alloys, metal nitrides and metal silicides, as well as polysilicon materials. The gate electrode conductor materials may be formed using methods including, but not limited to: plating methods, chemical vapor deposition methods (including atomic layer chemical vapor deposition methods) and physical vapor deposition methods (including sputtering methods). Typically, the gate electrodes 18 comprise a metal, metal silicide or polysilicon gate electrode conductor material having a thickness from about 500 to about 1500 angstroms.

As noted above, spacer layers 18 are intended as two component structures comprising: (1) the illustrated "L" or invented "L:" shaped portions adjoining the gate electrodes 16; in conjunction with, (2) the more traditional spacer shaped portions nested within the "L" shaped portions or the inverted "L" shaped portions. Each of the foregoing two component structures may comprise materials analogous, equivalent or identical to the materials from which are comprised the isolation region 12. The "L" or inverted "L" shaped structures are typically deposited using a conformal layer deposition method. The spacer shaped portions are formed using a blanket layer deposition and anisotropic etchback method.

The source/drain regions 20 are formed using a two step ion implantation method. A first step within the two step ion implantation method uses the gates 16, absent the spacers 18, as a mask to form extension regions into the semiconductor substrate 10. A second step within the two step ion implantation method uses the gates 16 and the spacers 18 as a mask to form conductor region portions of the source/drain regions 20 into the semiconductor substrate. Thus, the source/drain regions 20 comprise extension region components and conductor region components. Dopant concentrations within the source/drain regions 20 range from about $1 \times 10^{20}$ to about $3 \times 10^{21}$ dopant atoms per cubic centimeter.

The silicide layers 22 may comprise any of several metal silicide forming metals. Non-limiting examples of silicide forming metals include titanium, tungsten, nickel, cobalt, vanadium and molybdenum silicide forming metals. The silicide layers 22 are typically formed using a self-aligned silicide (i.e., salicide) method that provides for: (1) a blanket metal silicide forming metal layer deposition; (2) a subsequent thermal annealing to provide for silicide formation in contact with silicon; and (3) a subsequent excess silicide forming metal layer stripping. Typically, each of the silicide layers 22 has a thickness from about 50 to about 200 angstroms.

Figure 2:
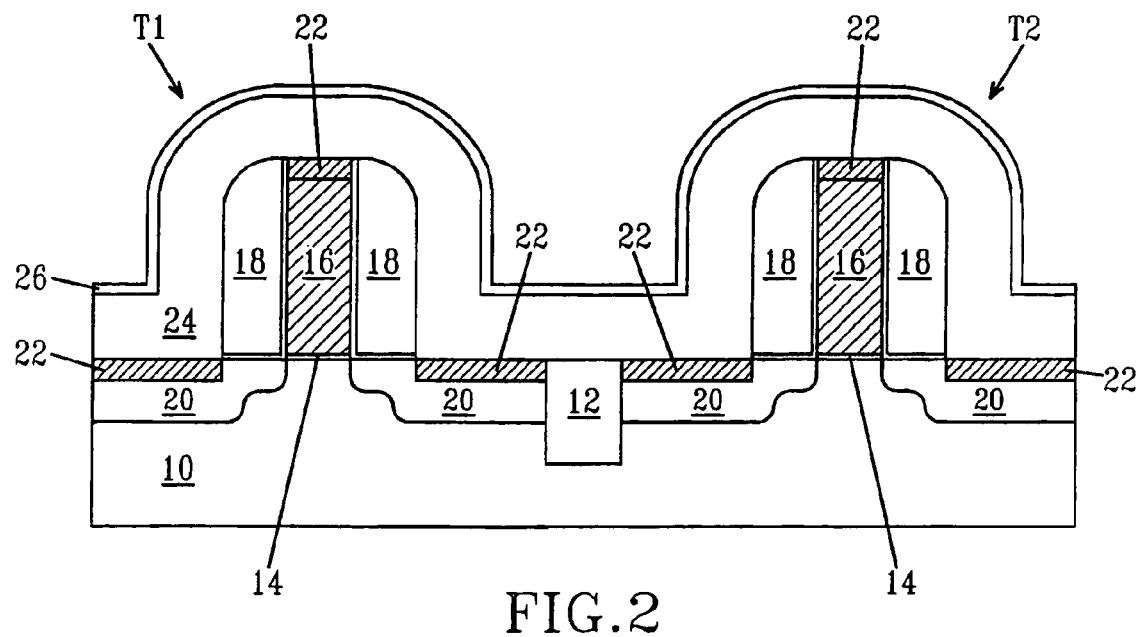

FIG. 2 shows a first stressed layer 24 located upon the CMOS structure of FIG. 1. FIG. 2 also shows an etch stop layer 26 located upon the first stressed layer 24.

The first stressed layer 24 comprises a material that has a first stress intended to compliment and enhance performance of the first transistor T1. When the first transistor T1 is an nFET, the first stress is preferably a tensile stress that provides a tensile stress within the channel of the first transistor T1. Under those circumstances, an electron charge carrier mobility within the first transistor T1 is enhanced. Conversely, when the first transistor is a pFET, a compressive stress of an overlying layer is desirable for purposes of generating compressive channel stress that yields an enhanced hole mobility.

Within the instant embodiment, the first transistor T1 is preferably an nFET and the first stressed layer 24 preferably comprises a tensile stressed layer.

The first stressed layer 24 may comprise any of several stressed materials. Non-limiting examples includes nitrides and oxynitrides. Nitrides are particularly common stressed layer materials insofar as different magnitudes and types of stress may be introduced into a nitride layer material by using different deposition conditions for forming the nitride layer. Particular deposition conditions that affect nitride layer stress include a changing of the ratio of a low frequency plasma to a high frequency plasma at temperature range from 200° C. to 600° C.

Typically, the first stressed layer 24 comprises a nitride material that has a thickness from about 500 to about 1000 angstroms, although the invention is not limited to stressed layers comprising only nitride materials.

The etch stop layer 26 may comprise any of several etch stop materials. Etch stop materials will typically have a different composition from the first stressed layer 24. Typically, the etch stop layer 26 comprises an oxide etch stop material when the first stressed layer 24 comprises a nitride material. Within the instant embodiment, the etch stop layer 26 typically comprises a silicon oxide etch stop material that has a thickness from about 50 to about 300 angstroms. The etch stop layer 26 may be formed using methods analogous to the methods used for forming the isolation region 12.

Figure 3:
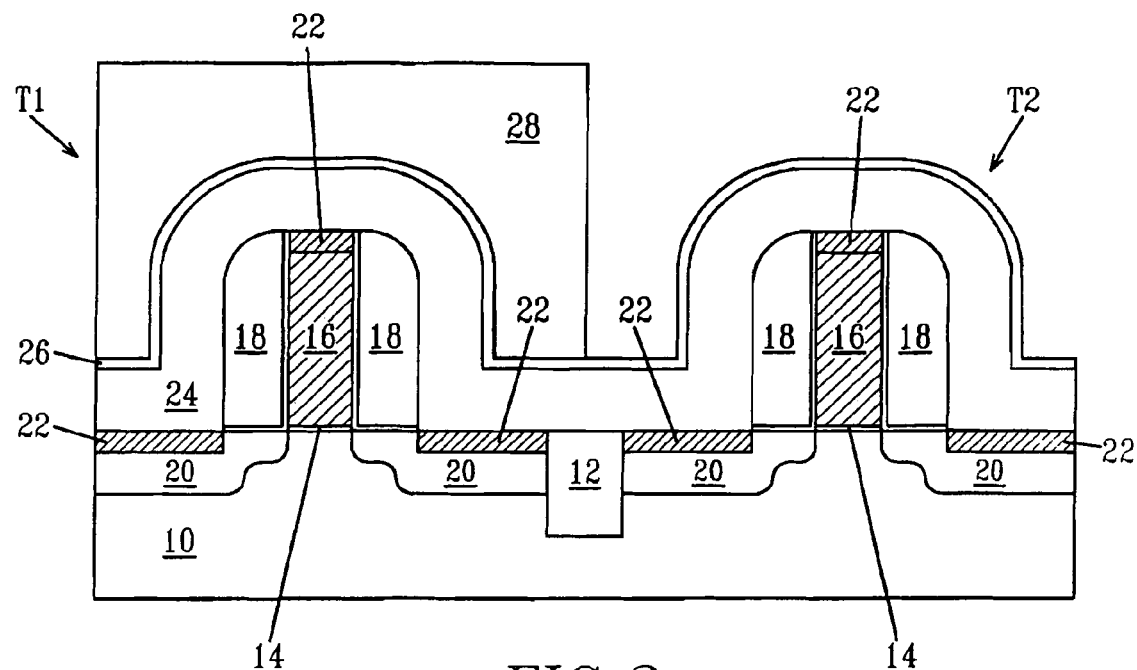

FIG. 3 shows a block mask 28 located upon the etch stop layer 26 and covering the first transistor T1. The block mask 28 may comprise any of several mask materials. Non-limiting examples include hard mask materials and photoresist mask materials. Photoresist mask materials are considerably more common. Non-limiting examples of photoresist mask materials include positive photoresist materials, negative photoresist materials and hybrid photoresist materials. Typically, the block mask 28 comprises a photoresist material having a thickness from about 1000 to about 5000 angstroms.

Figure 4:
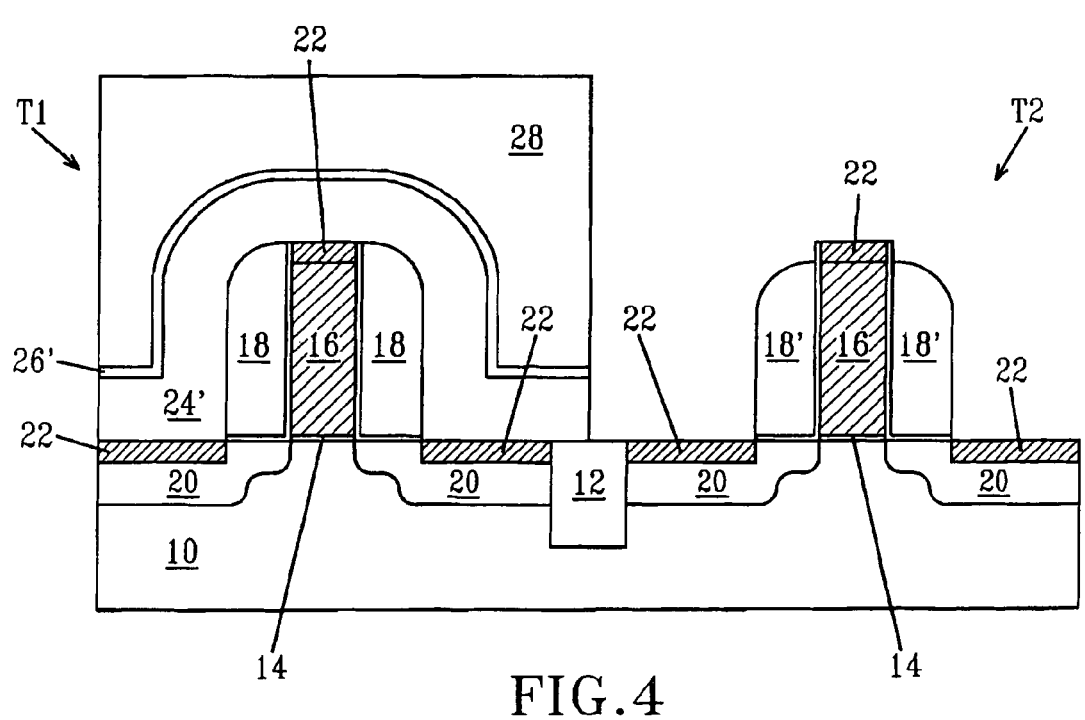

FIG. 4 shows the results of etching the etch stop layer 26 and the first stressed layer 24 to form corresponding etch stop layer 26' and first stressed layer 24', while using the block mask 28 as an etch mask. The foregoing etching is typically undertaken while using a plasma etchant, although neither the embodiment nor the invention is so limited. Wet chemical etchants, while generally less common, may also be used. Typically, the plasma etchant uses a fluorine containing etchant gas composition for etching each of the etch stop layer 26 and the first stressed layer 24 when forming therefrom the etch stop layer 26' and the first stressed layer 24'. As is illustrated in FIG. 4, the etching also forms the spacers 18' from the spacers 18.

Figure 5:
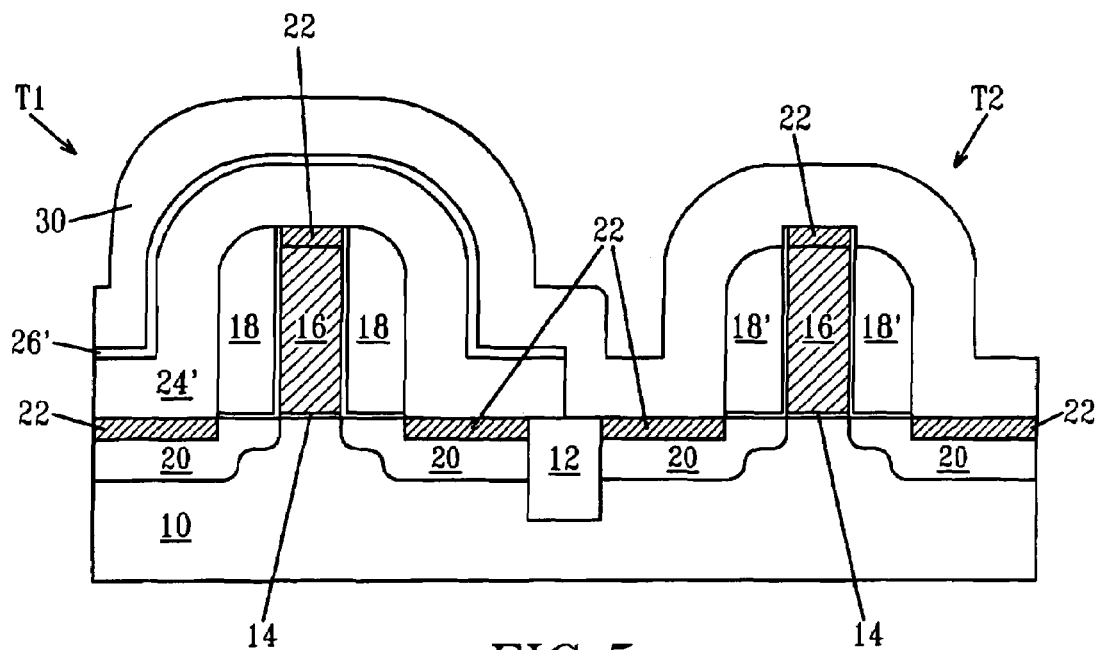

FIG. 5 first shows the results of stripping the block mask 28 from the CMOS structure of FIG. 4. The block mask 28 may be stripped using methods and materials that are otherwise conventional in the semiconductor fabrication art. Included are wet chemical stripping methods and materials, dry plasma stripping methods and materials and aggregate stripping methods and materials thereof. Dry plasma stripping methods and materials are particularly common, but do not limit the invention.

FIG. 5 also shows a second stressed layer 30 located upon the semiconductor structure of FIG. 4, subsequent to removing the block mask 28 therefrom.

The second stressed layer 30 has an appropriate stress engineered to promote enhanced performance (generally within the context of charge carrier mobility) of the second transistor T2. The second stressed layer 30 may comprise materials and have dimensions that are analogous, equivalent or identical to the materials and dimensions used for forming the first stressed layer 24 that is illustrated in FIG. 3. As is disclosed above, the first stressed layer 24 typically comprises a silicon nitride material whose stress (i.e., tensile or compressive) may be engineered incident to control of particular deposition conditions. The second stressed layer 30 thus also comprises a nitride material, but for which deposition conditions are selected to have a type of stress (i.e., tensile or compressive) typically opposite the first stressed layer 24.

Within the context of the instant embodiment, the first stressed layer 24 preferably comprises a tensile stress from about 500 MPa to about 4 GPa (when the first transistor T1 is an nFET) and the second stressed layer 30 preferably a compressive stress from about −500 MPa to about −5 GPa (when the second transistor T2 is a pFET).

Figure 6:
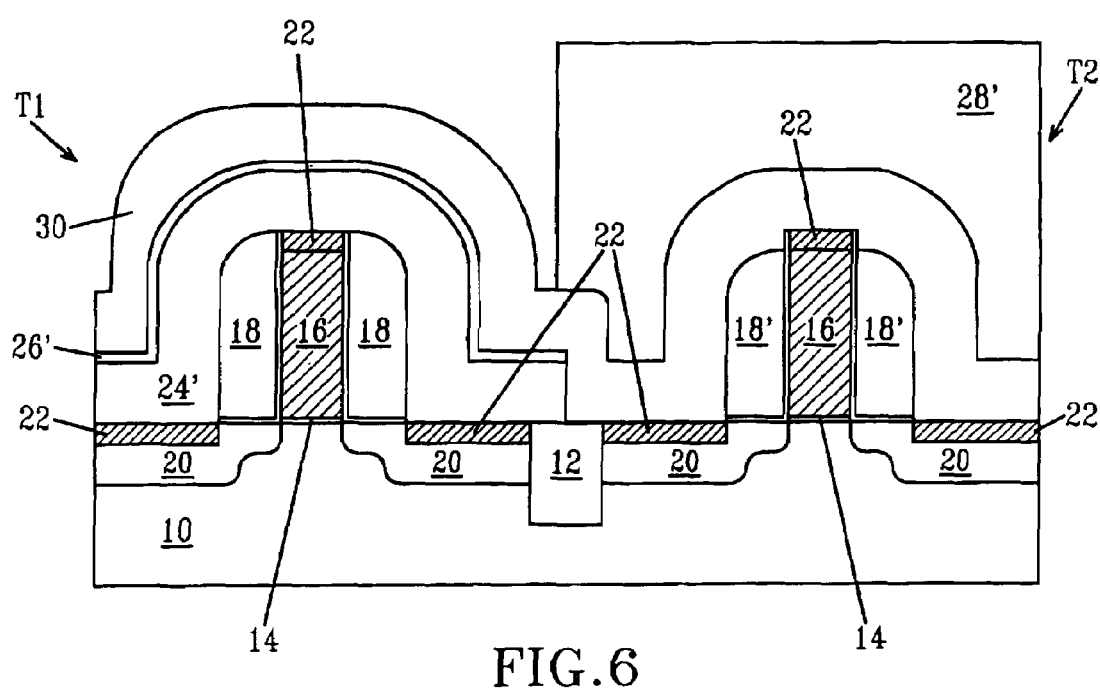

FIG. 6 shows a block mask 28' located upon the second stressed layer 30 and covering the second transistor T2. The block mask 28' otherwise comprises materials and has dimensions analogous or equivalent to the block mask 28 that is illustrated in FIG. 3.

Figure 7:
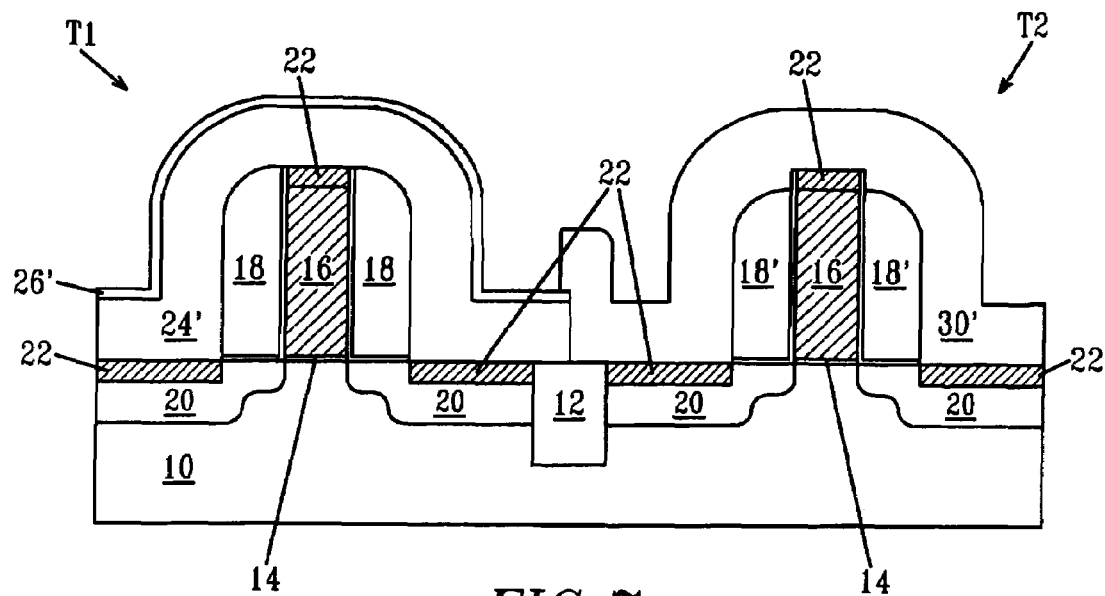

FIG. 7 shows the results of patterning the second stressed layer 30 to form a second stressed layer 30', and subsequently stripping the block mask 28' from the CMOS structure of FIG. 6.

The second stressed layer 30 may be etched to form the second stressed layer 30' while using methods and materials analogous equivalent or identical to the methods and materials used for etching the first stressed layer 24 to from the first stressed layer 24'. The second block mask 28' may be stripped using methods and materials analogous equivalent or identical to the methods and materials used for stripping the first block mask 28.

As is illustrated within the schematic diagram of FIG. 7, the first stressed layer 24' and the second stressed layer 30' abut and overlap.

Figure 8:
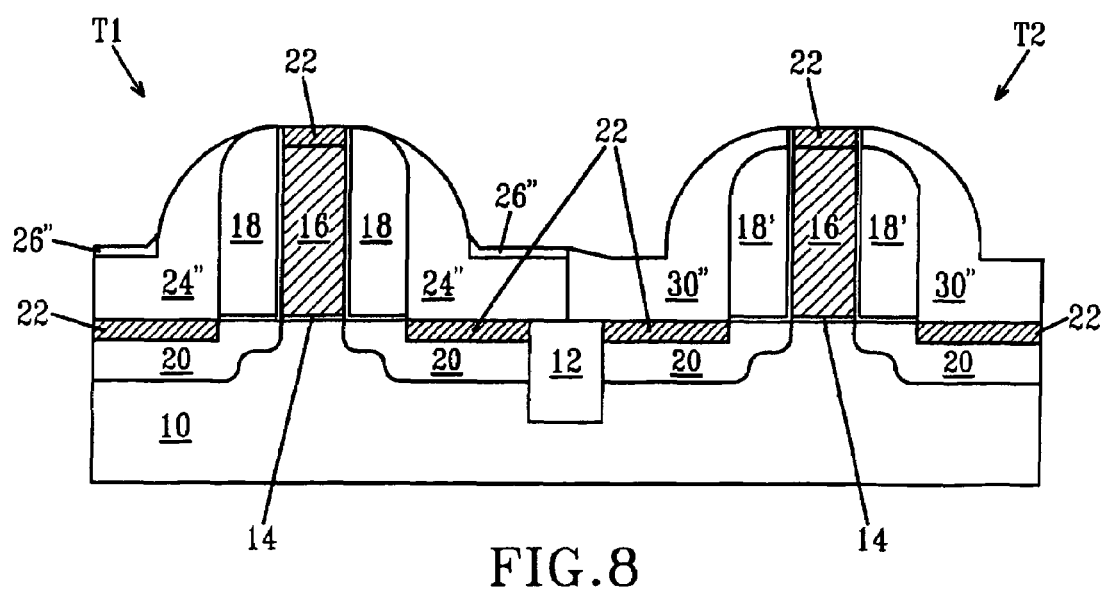

FIG. 8 shows the results of etching the etch stop layer 26', the first stressed layer 24' and the second stressed layer 30' so that a resulting first stressed layer 24" and a resulting second stressed layer 30" abut and do not overlap, rather than abut and overlap. Also resulting from this etching is etch stop layers 26".

The foregoing etching may be undertaken using methods that are conventional in the semiconductor fabrication art. Non-limiting examples are plasma etch methods and sputter etch methods. Desirable are sputter etch methods that use argon or nitrogen sputter etchants. Such sputter etchants desirably have a tendency to etch more from top surfaces than lower surfaces of the first stressed layer 24' and the second stressed layer 30' when forming the first stressed layer 24" and the second stressed layer 30".

Within the context of the instant embodiment and the invention, the abutment of the first stressed layer 24" with the second stressed layer 30" absent overlap thereof provides for enhanced manufacturability. The enhanced manufacturability is desirable under circumstances where overlapped portions of the first stressed layer 24' and the second stressed layer 30' are located over a contact region portion of a source/drain region, particularly when the source/drain region has a silicide layer thereupon.

Figure 9:
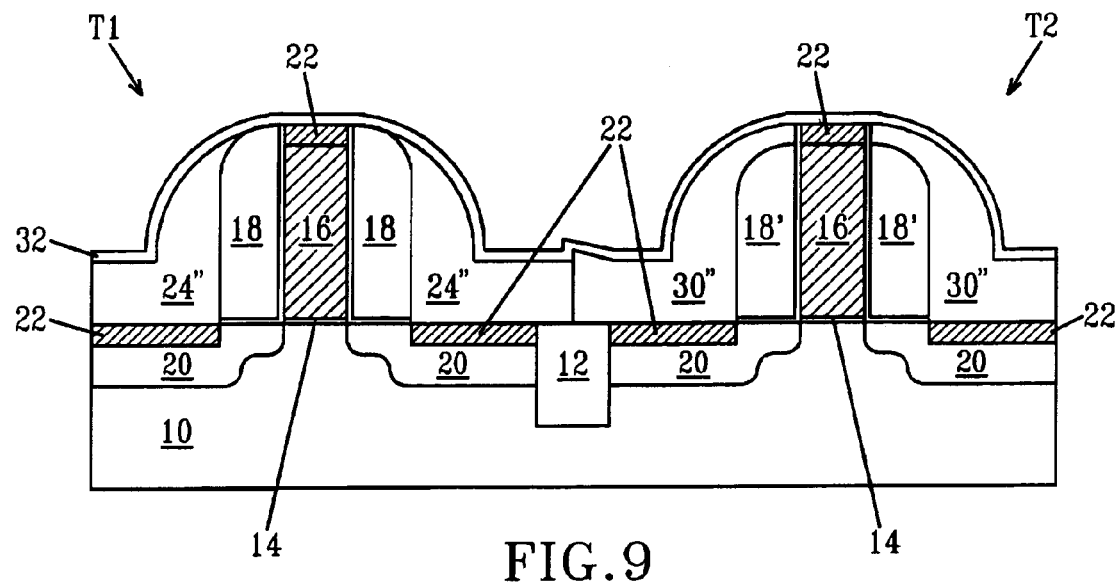

FIG. 9 shows the results of etching remaining portions of the etch stop layer 26" from the CMOS structure of FIG. 8. FIG. 9 also shows a capping layer 32 located upon the CMOS structure of FIG. 8 after etching remaining portions of the etch stop layer 26". The remaining portions of the etch stop layer 26" may be etched using a wet chemical etchant or a dry plasma etchant.

The capping layer 30 may comprise any of several capping materials. Included are oxides, nitrides and oxynitrides of silicon, as well as oxides, nitrides and oxynitrides of other elements. The capping layer 32 preferably comprises a silicon nitride material having a thickness from about 50 to about 100 angstroms.

FIG. 9 shows a CMOS structure in accordance with a first embodiment of the invention. The CMOS structure comprises complementary first stressed layer 24" located upon first transistor T1 and second stressed layer 30" located upon second transistor T2. The complementary first stressed layer 24" and second stressed layer 30" abut, but do not overlap at a location interposed between the first transistor T1 and the second transistor T2.

Since the complementary first stressed layer 24" and second stressed layer 30" abut, but do not overlap, the CMOS structure that is illustrated in FIG. 9 provides for enhanced manufacturability. The enhanced manufacturability results from a nominally level surface provided by the first stressed layer 24" and the second stressed layer 30" so that a contact via may be efficiently etched reaching a source/drain region 20 having a silicide layer 22 thereupon while not damaging the silicide layer 22.

Figure 10:
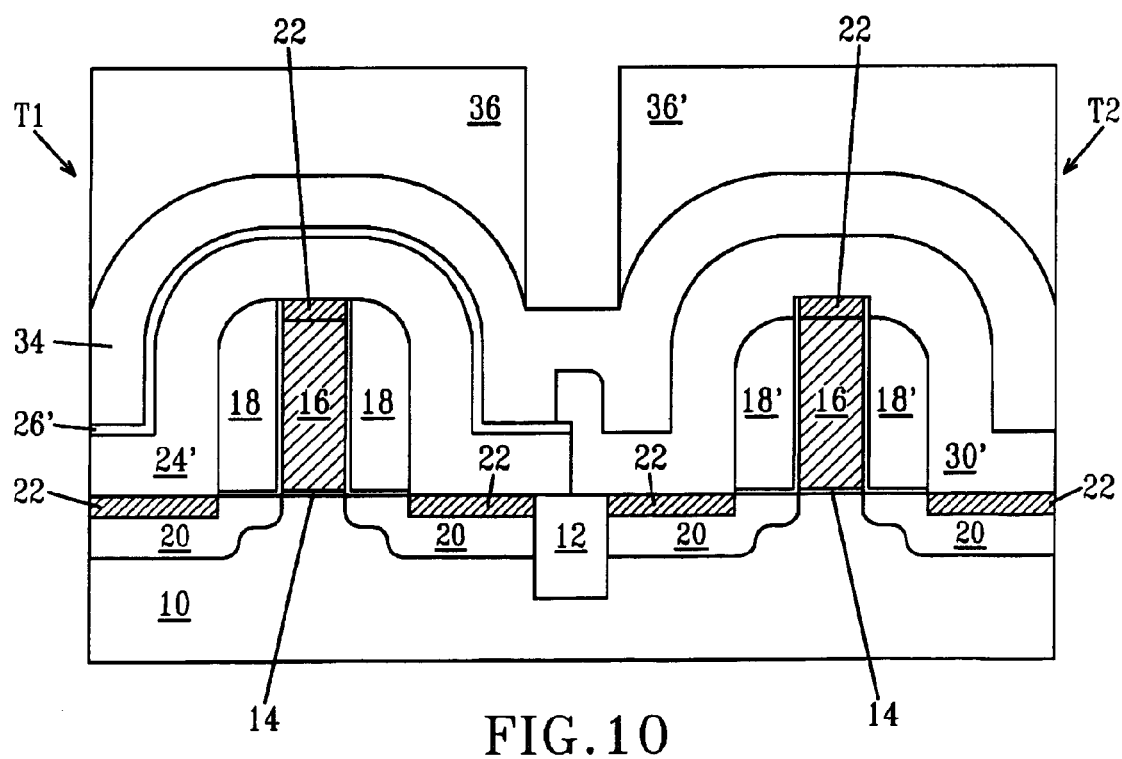
FIG. 10 to FIG. 12 show a series of schematic cross-sectional diagrams illustrating the results of progressive stages in fabricating a CMOS structure in accordance with another embodiment of the invention.
Figure 11:
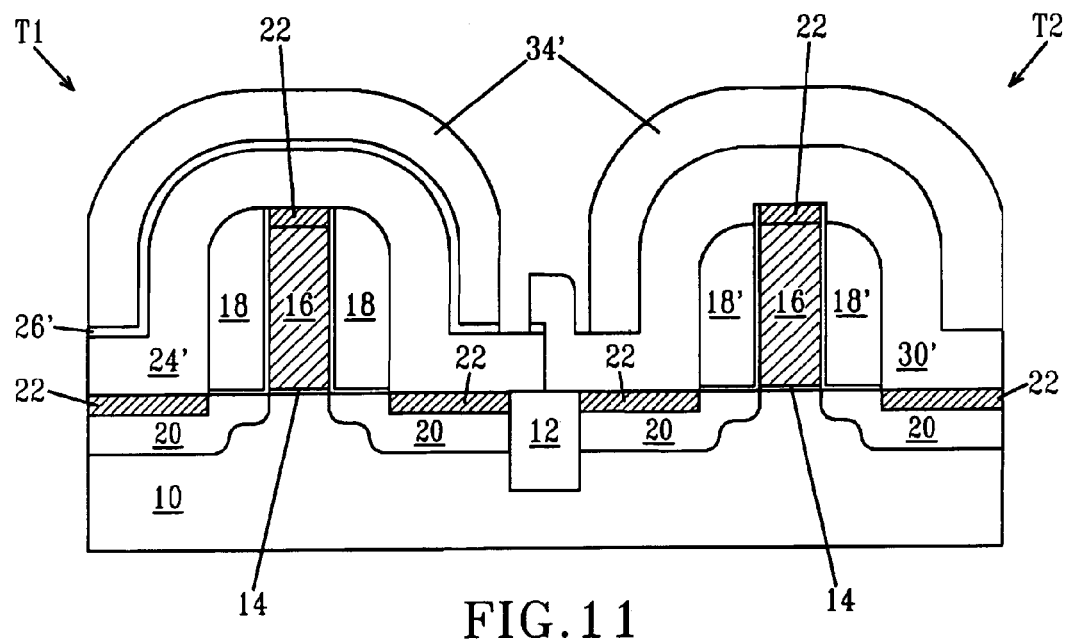
Figure 12:
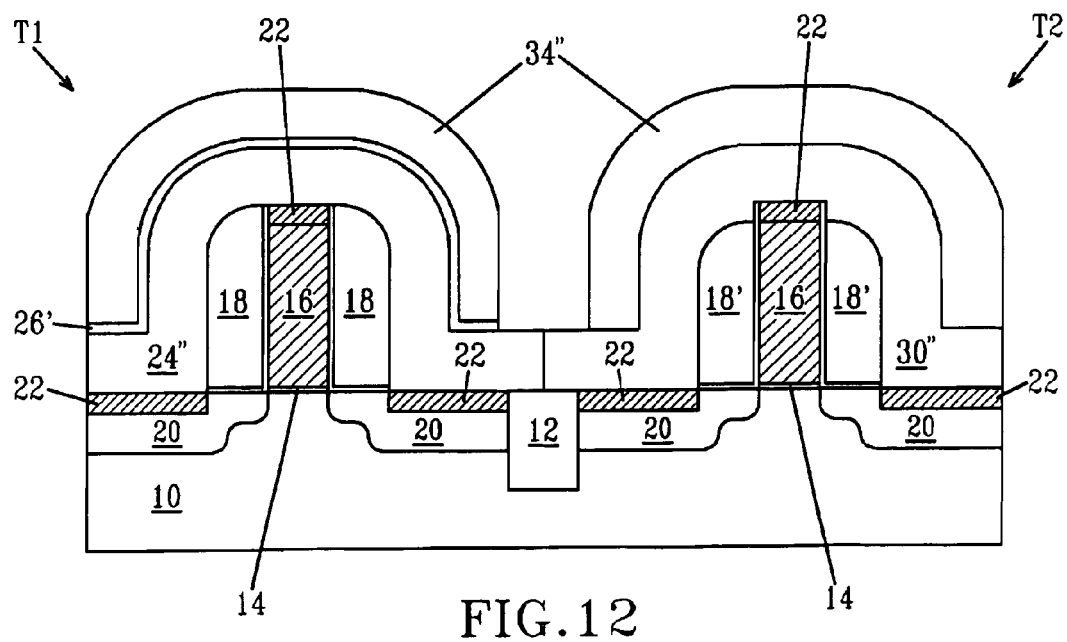

FIG. 10 to FIG. 12 show a series of schematic cross-sectional diagrams illustrating the results of progressive stages in fabricating a CMOS structure in accordance with another embodiment of the invention. This other embodiment of the invention comprises a second embodiment of the invention.

FIG. 10 shows a CMOS structure that derives from the CMOS structure of FIG. 7 within the first embodiment. The CMOS structure of FIG. 10 however shows a blocking layer 34 located upon the CMOS structure of FIG. 7. A block mask 36 is located upon the blocking layer 34 and covering the first transistor T1. A block mask 36' is located upon the blocking layer 34 and covering the second transistor T2.

The blocking layer 34 preferably comprises an oxide material under circumstances where the first stressed layer 24 and the second stressed layer 30 comprise nitride materials. The blocking layer 34 may be formed using methods and materials analogous, equivalent or identical to the methods and materials used for forming the etch stop layer 26. Typically, the blocking layer 34 has a thickness from about 300 to about 500 angstroms.

The block masks 36 and 36' may comprise any of several block mask materials that are disclosed above for the block masks 28 and 28'.

FIG. 1 shows the results of further processing of the CMOS structure of FIG. 10. FIG. 11 shows the results of etching the blocking layer 34 to form blocking layers 34' that straddle the first transistor T1 and the second transistor T2. In so doing, an abutted and overlapped portion of the first stressed layer 24' and the second stressed layer 30' is exposed. FIG. 11 also shows the results of stripping the block masks 36 and 36'.

FIG. 12 shows the results of further processing of the CMOS structure of FIG. 11. FIG. 12 shows the results of etching the first stressed layer 24' and the second stressed layer 30' to yield first stressed layer 24" and second stressed layer 30" that are abutted and do not overlap. The etching preferably uses a nitrogen or argon sputter etching as is disclosed above within the context of the first embodiment.

For reasons disclosed above within the context of the first embodiment, abutment absent overlap of the first stressed layer 24" and the second stressed layer 30" provides for enhanced manufacturability of the CMOS structure of FIG. 12.

Within the second embodiment, the use of the blocking layers 34' also assist in preserving a full initial thicknesses of the first stressed layer 24" and the second stressed layer 30" at locations over the first transistor T1 and the second transistor T2. Thus, a full effect of stress from the first stressed layer 24" and the second stressed layer 30" is transmitted into respective semiconductor channels over which they are formed.

Figure 13:
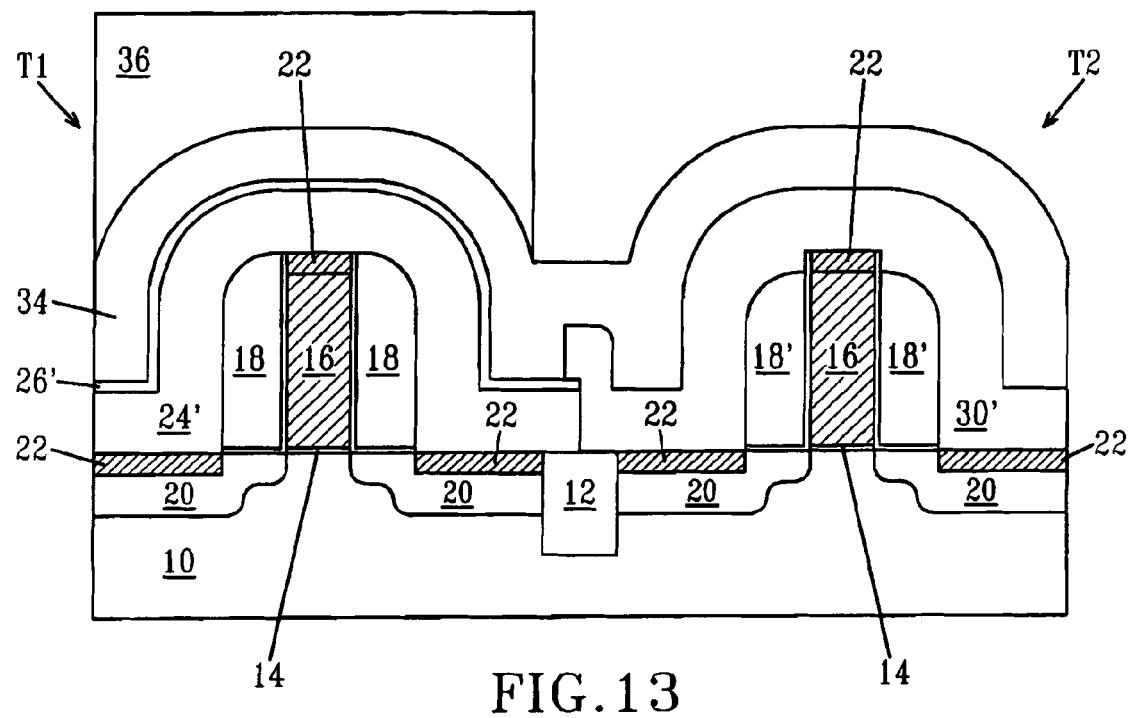
FIG. 13 to FIG. 15 show a series of schematic cross-sectional diagrams illustrating the results of progressive stages in fabricating a CMOS structure in accordance with yet another embodiment of the invention.
Figure 14:
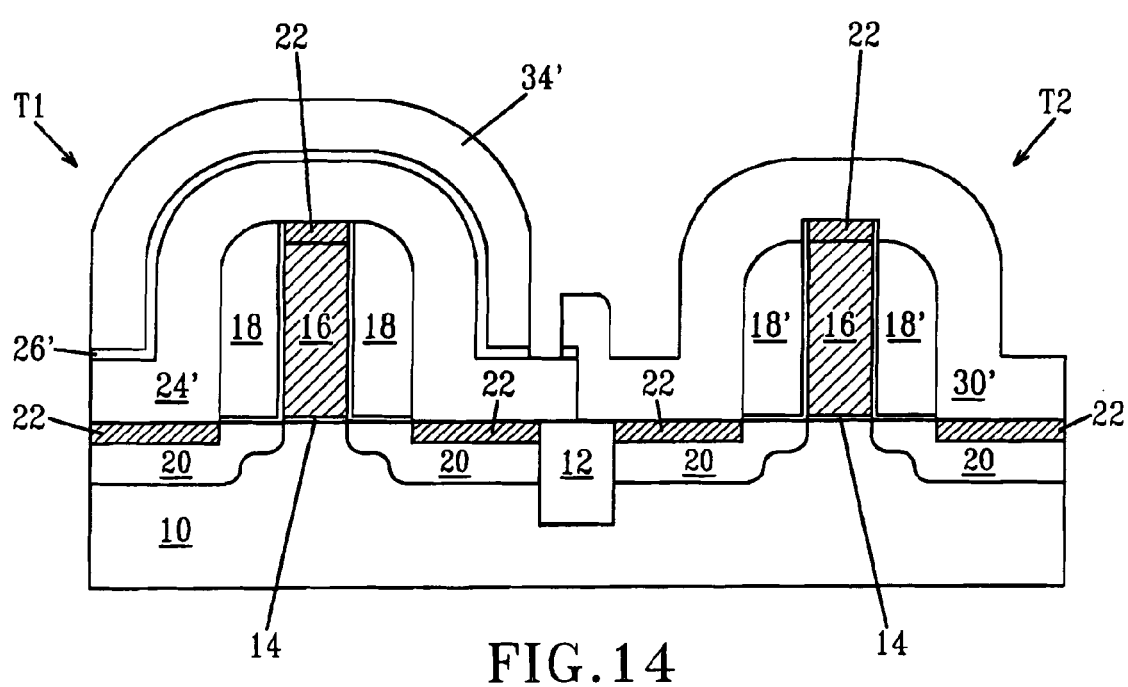
Figure 15:
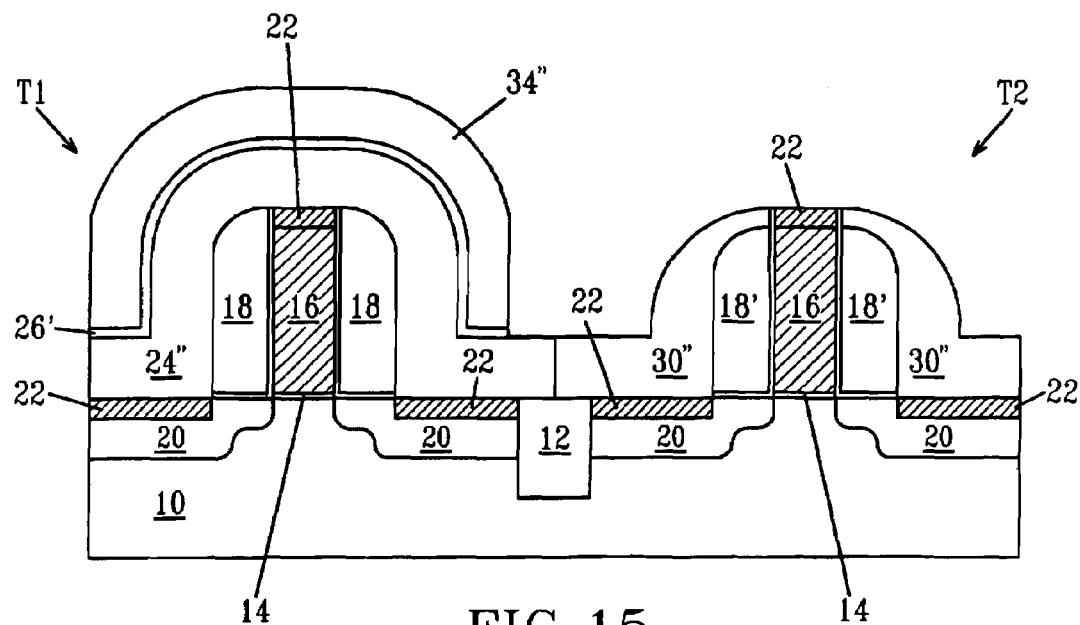

FIG. 13 to FIG. 15 show a series of schematic cross-sectional diagrams corresponding with FIG. 10 to FIG. 12, but where the block mask 36 is located over the first transistor T1 only, and not the second transistor T2. FIG. 13 to FIG. 15 comprise a third embodiment of the invention.

Figure 16:
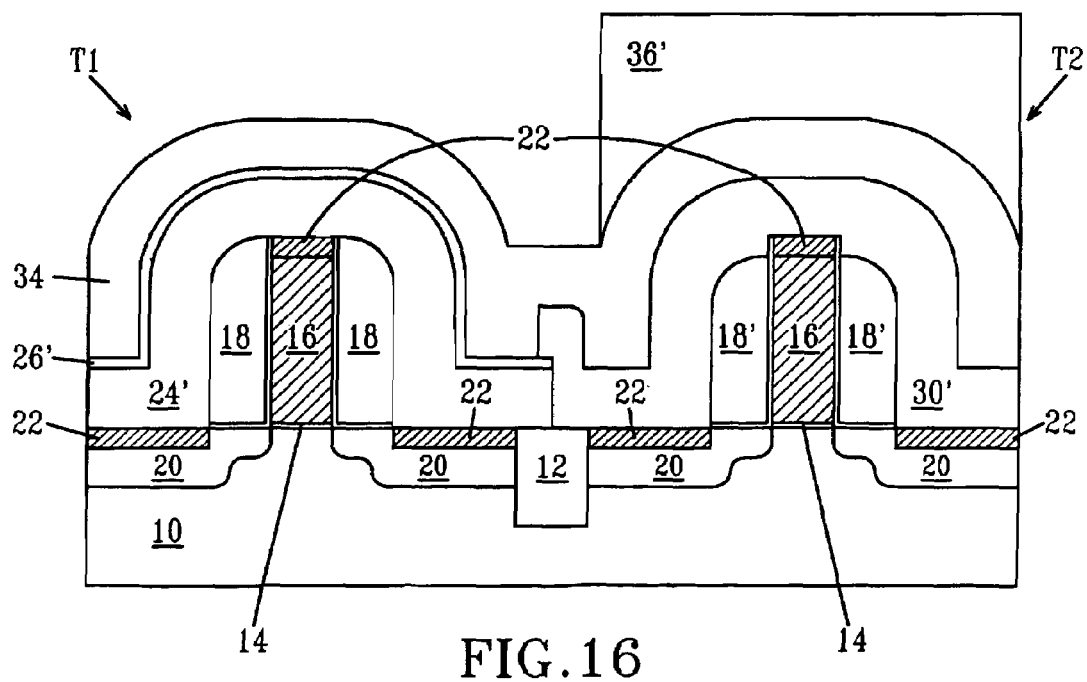
FIG. 16 to FIG. 18 show a series of schematic cross-sectional diagrams illustrating the results of progressive stages in fabricating a CMOS structure in accordance with still yet another embodiment of the invention.
Figure 17:
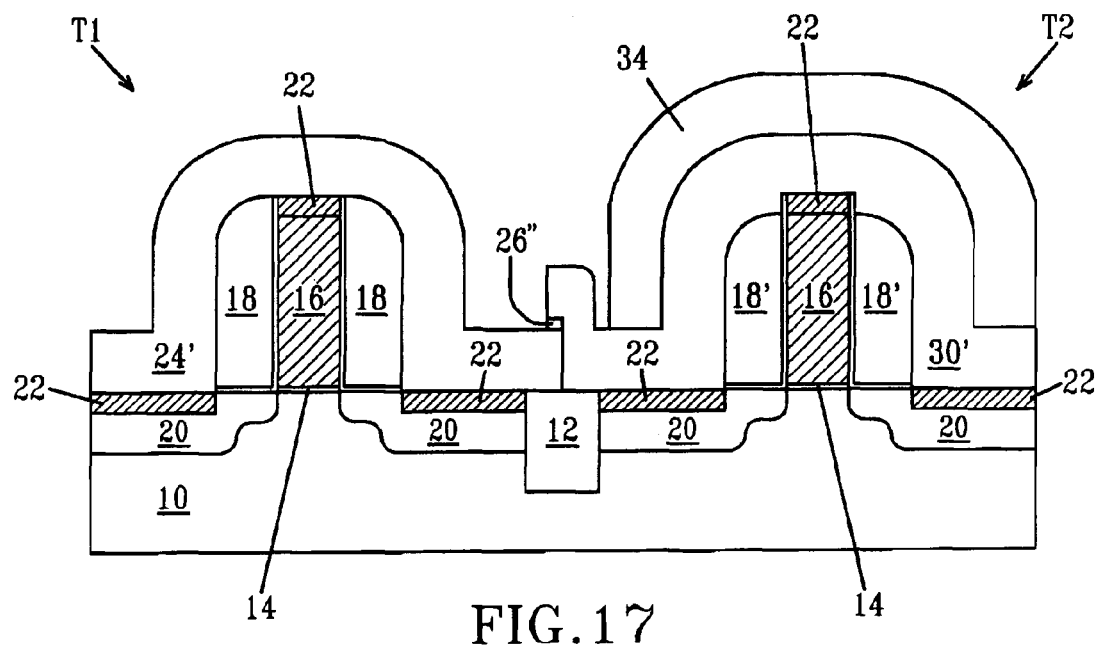
Figure 18:
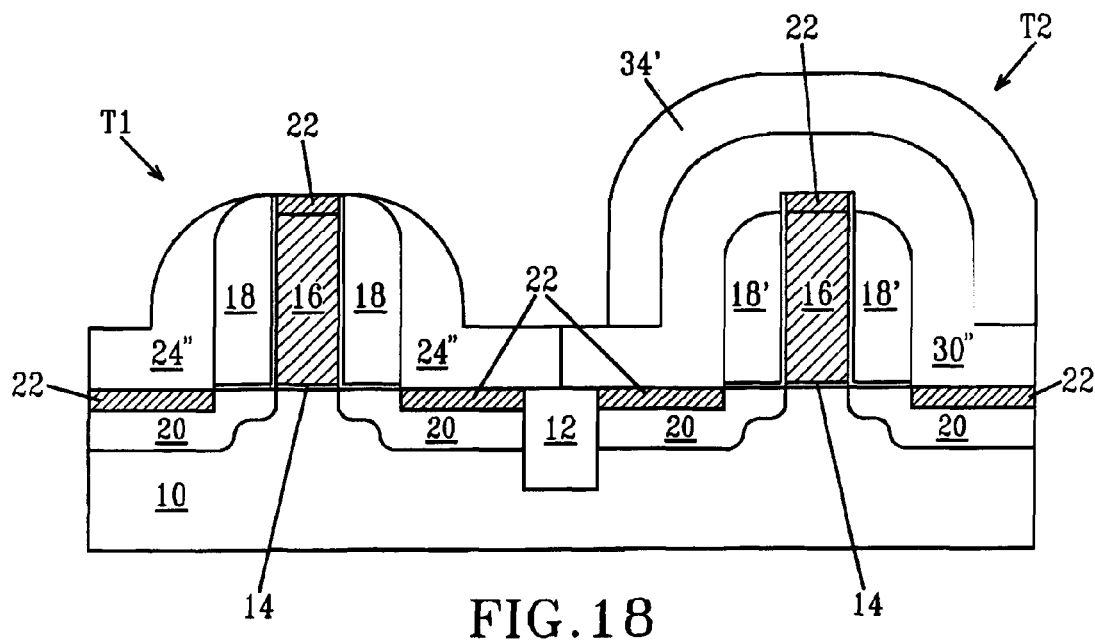

FIG. 16 to FIG. 18 show a series of schematic cross-sectional diagrams corresponding with FIG. 10 to FIG. 12 or FIG. 13 to FIG. 15, but where the block mask 36' is located over the second transistor T2 only and not the first transistor T1. FIG. 16 to FIG. 18 comprise a fourth embodiment of the invention.

The processing for either FIG. 13 to FIG. 15 or FIG. 16 to FIG. 18 follows analogously from the processing of FIG. 10 to FIG. 12. However, due to the presence of only a single block mask 36 or 36', only one of the first stressed layer 24" (i.e., FIG. 15) and the second stressed layer 30" (i.e., FIG. 18) has an initial thickness after sputter etching.

In each of the second embodiment of the invention that is illustrated in FIG. 10 to FIG. 12, the third embodiment of the invention that is illustrated in FIG. 13 to FIG. 15 and the fourth embodiment of the invention that is illustrated in FIG. 16 to FIG. 18, the first stressed layer 24' that abuts and overlaps the second stressed layer 30' are etched to form the first stressed layer 24" and the second stressed layer 30" that abut, but do not overlap.

In accordance with the first embodiment of the invention, the second embodiment, the third embodiment and the fourth embodiment provide for enhanced manufacturability of a CMOS structure due to the foregoing abutment absent overlap.

The preferred embodiments of the invention are illustrative of the invention rather than limiting of the invention. Revisions and modifications may be made to methods, materials, structures and dimensions of a CMOS structure or method for fabrication thereof in accordance with the preferred embodiments of the invention while still providing a CMOS structure in accordance with the invention, further in accordance with the accompanying claims.

What is claimed is:

1. A method for fabricating a CMOS structure comprising:
    forming a first transistor of a first polarity laterally separated from a second transistor of a second polarity different than the first polarity over a semiconductor substrate;
    forming a first stressed layer having a first stress located over the first transistor and a second stressed layer having a second stress different from the first stress located over the second transistor, where the first stressed layer and the second stressed layer abut and overlap;
    forming a blanket layer over the first stressed layer and the second stressed layer that abut and overlap;
    further masking the blanket layer over the first stressed layer and the second stressed layer to leave uncovered at least the portion of the first stressed layer and the second stressed layer that abut and overlap; and
    etching the blanket layer and at least one of the first stressed layer and the second stressed layer so that the first stressed layer and the second stressed layer abut and do not overlap.

2. The method of claim 1 further comprising forming a blocking layer over the first stressed layer and the second stressed layer prior to further masking has been deleted.

3. The method of claim 1 wherein the forming the first transistor and the second transistor uses a hybrid orientation substrate that provides a different crystallographic orientation channel for each of the first transistor and the second transistor.

4. The method of claim 1 wherein each of the first stressed layer and the second stressed layer comprises a nitride material.

5. The method of claim 1 wherein:
    the first stress is a tensile stress and the first transistor is an nFET; and
    the second stress is a compressive stress and the second transistor in a pFET.

6. The method of claim 1 wherein the etching provides that the first stressed layer and the second stressed layer abut but do not overlap over a source/drain region within one of the first transistor and the second transistor.

* * * * *